United States Patent
Trecarichi et al.

(10) Patent No.: US 9,013,224 B2
(45) Date of Patent: Apr. 21, 2015

(54) SOFT TURN-ON IN AN IGNITION SYSTEM OF A COMBUSTION ENGINE

(75) Inventors: Calogero Andrea Trecarichi, Aci Catena (IT); Giovanni Luca Torrisi, Aci Catena (IT); Donato Tagliavia, Acireale (IT)

(73) Assignee: STMicroelectronics S.r.l., Agrate Brianza (IL)

( * ) Notice: Subject to any disclaimer, the term of this patent is extended or adjusted under 35 U.S.C. 154(b) by 466 days.

(21) Appl. No.: 13/609,008

(22) Filed: Sep. 10, 2012

(65) Prior Publication Data

US 2013/0068204 A1     Mar. 21, 2013

(30) Foreign Application Priority Data

Sep. 16, 2011  (IT) ............................... MI2011A1669

(51) Int. Cl.
| | | |
|---|---|---|
| H03K 17/04 | (2006.01) | |
| F02P 3/04 | (2006.01) | |
| F02P 3/05 | (2006.01) | |
| F02P 11/02 | (2006.01) | |
| H03K 17/16 | (2006.01) | |

(52) U.S. Cl.
CPC ................ F02P 3/0435 (2013.01); F02P 3/05 (2013.01); F02P 11/02 (2013.01); H03K 17/166 (2013.01); H03K 17/168 (2013.01)

(58) Field of Classification Search
CPC .... F02P 3/0453; F02P 3/053; F02D 41/1402; F02D 2041/2034; F02D 2041/2048
USPC ............ 123/594–618; 327/376, 378; 361/253
See application file for complete search history.

(56) References Cited

U.S. PATENT DOCUMENTS

| | | | | |
|---|---|---|---|---|
| 5,127,388 | A * | 7/1992 | Cicalese et al. | 123/644 |
| 5,399,942 | A * | 3/1995 | Frus | 315/209 R |
| 5,859,205 | A * | 1/1999 | Adair et al. | 530/387.3 |
| 6,353,293 | B1 * | 3/2002 | Frus et al. | 315/209 R |
| 7,080,639 | B1 | 7/2006 | Pattantyus | |
| 7,293,554 | B2 * | 11/2007 | Moran et al. | 123/650 |
| 7,924,081 | B2 * | 4/2011 | Lorenzo et al. | 327/376 |
| 2002/0109417 | A1 | 8/2002 | Torrisi et al. | |
| 2008/0197717 | A1 * | 8/2008 | Lorenzo et al. | 307/139 |

FOREIGN PATENT DOCUMENTS

EP              1577545 A1     9/2005

* cited by examiner

*Primary Examiner* — Stephen K Cronin
*Assistant Examiner* — Joseph Dallo
(74) *Attorney, Agent, or Firm* — Seed IP Law Group PLLC

(57) ABSTRACT

A switching system for a combustion engine ignition system comprises a switching device switchable between an accumulation condition and a transfer condition to activate an ignition element. The switching system comprises control logic that provides a control signal for controlling the switching device, measures a progress indicator indicative of progress in switching the switching device from the transfer condition to the accumulation condition, and causes the control signal to vary with a first variation rate during a first stage until the progress indicator reaches a first progress condition. The control logic causes the control signal to vary with a second variation rate, lower than the first variation rate, during a second stage until the progress indicator reaches a second progress condition, and causes the control signal to vary with a third variation rate, higher than the second variation rate, during a third stage of the preliminary switching.

26 Claims, 6 Drawing Sheets

SOFT TURN-ON IN AN IGNITION SYSTEM OF A COMBUSTION ENGINE

BACKGROUND

1. Technical field

The solution according to one or more embodiments of the present disclosure generally relates to the field of electronics. More particularly, this solution relates to switching systems for igniting combustion engines.

2. Description of the Related Art

Nowadays, in almost every combustion engine (for example, in the automotive field) the ignition of a corresponding combustion is usually provoked by an ignition system of the electronic type. Typically, the ignition system comprises a switching device (for example, an insulated gate bipolar transistor, or IGBT), which controls the ignition sparks of spark plugs of the combustion engine. For this purpose, the IGBT is coupled with a primary winding of a transformer; the transformer has one or more secondary windings, each of which is coupled with a respective spark plug. During each cycle of the combustion engine, the IGBT is firstly turned on by applying a suitable voltage to its gate terminal. As a result, the primary winding is charged with a current having a substantially linear pattern. To create the ignition spark, the IGBT is turned off causing an abrupt cut of the corresponding current. Consequently, an extra-voltage develops across the primary winding (proportional to the change rate of the current of the IGBT); this extra-voltage (properly clamped by a high voltage zener Z, in order to avoid an eventual breakdown of the IGBT) is reflected to each secondary winding multiplied by a turns ratio (i.e., the ratio between the number of turns of a conduction wire in the secondary winding and the number of turns of a conduction wire in the primary winding) of the transformer. Therefore, a very high voltage (in the order of thousands of Volts) is set across each spark plug causing the firing of the ignition spark.

However, the current through the IGBT also changes when it turns on (according to a duration of a turn-on transient period of the IGBT). This causes a corresponding extra-voltage across the primary winding, which results in an overshoot voltage across the secondary winding that may cause an undesired ignition spark. Such undesired ignition spark may provoke an earlier ignition of the combustion engine, thereby lowering the efficiency or even causing serious engine damages, since the anomalous spark could occur in a wrong point of the combustion engine cycle.

In order to solve this problem, it is known in the art to control the IGBT in such a way to obtain a so-called soft turn-on thereof, wherein the IGBT is turned on gradually. For this purpose, it is possible to apply a relatively small direct current to the gate terminal of the IGBT; this current charges corresponding stray capacitors of the IGBT, to increase the gate voltage slowly until the IGBT turns on. In this way, a change rate of the current across the IGBT is greatly reduced (thereby avoiding any undesired ignition spark).

However, some operating parameters of the IGBT (such as its threshold voltage) are strictly related to environment conditions (such as an external temperature). Therefore, the soft turn-on of the IGBT may lose efficiency whenever the value of its operating parameters varies with respect to the expected values according to which the soft turn-on is designed. Moreover, values of the operative parameters may randomly differ from nominal values due to non-ideality inherent to the manufacturing process of the IGBT (e.g., manufacturing tolerances), from now on indicated as manufacturing process spreads for sake of conciseness. The values of the operative parameters may also change because of an aging of the IGBT. Thereby, such variations in the operative parameters cause a permanent efficiency loss of its soft turn-on. In addition, it is also possible that, for the above-mentioned reasons, the same operating parameters become inadequate for switching the IGBT on, with the consequence that the IGBT would remain always off, preventing the combustion engine from operating.

Another technique known in the art for reducing the overshoots on the secondary winding calls for providing a voltage limiter device between each secondary winding and the respective spark plug.

However, such technique is inherently expensive since for each spark plug of the engine a corresponding voltage limiter device should be provided.

BRIEF SUMMARY

One embodiment of the present disclosure implements a soft turn-on in an ignition system of a combustion engine.

One embodiment of the disclosure provides a switching system for use in an ignition system of a combustion engine. The switching system comprises a switching device switchable between an accumulation condition (for accumulating energy in a first portion of the ignition system) and a transfer condition (for transferring said energy from the first portion of the ignition system to a second portion of the ignition system) to activate at least one ignition element of the combustion engine. The switching system further comprises a control logic having means for providing a control signal for controlling the switching device. The control signal varies between a transfer value corresponding to the transfer condition and an accumulation value corresponding to the accumulation condition. The control logic further has means for measuring a progress indicator indicative of a progress of a preliminary switching of the switching device from the transfer condition to the accumulation condition, and means for causing the control signal to vary with a first variation rate during a first stage of the preliminary switching until the progress indicator reaches a first value indicative of a first progress condition of the preliminary switching following the accumulation condition. In the solution according to the present disclosure the control logic further comprises means for causing the control signal to vary with a second variation rate lower than the first variation rate during a second stage of the preliminary switching following the first stage until the progress indicator reaches a second value indicative of a second progress condition of the preliminary switching following the first progress condition, and means for causing the control signal to vary with a third variation rate higher than the second variation rate during a third stage of the preliminary switching following the second stage.

According to an embodiment of the disclosure, the third variation rate may be higher than the first variation rate.

In an embodiment of the disclosure, the switching device has a first conduction terminal and a second conduction terminal for connection in the ignition system, and the progress indicator may be an operative voltage of the switching device between the first conduction terminal and the second conduction terminal.

In an embodiment of the disclosure, the switching device has a control terminal for receiving the control signal, the control signal being a control voltage, and the means for providing a control signal may comprise means for generating the control voltage from a control current, and means for setting the control current selectively to a first amplitude, a second amplitude or a third amplitude corresponding to the first variation rate, the second variation rate or the third variation rate, respectively.

In an embodiment of the disclosure, the transfer condition may be an open condition of the switching device and the accumulation condition may be a close condition of the switching device.

In an embodiment of the disclosure, the progress indicator may have an initial value in the transfer condition and a final value in the accumulation condition, a difference between the first value and the final value being comprised between 85-95% of a difference between the initial value and the final value, and a difference between the second value and the final value being lower than 50% of the difference between the initial value and the final value.

In an embodiment of the disclosure, the switching system may comprise means for detecting a time-out wherein a duration of the second stage reaches a predetermined maximum duration, and means for forcing the control signal to vary with the third variation rate in response to the detection of the time-out.

In an embodiment of the disclosure, the switching system may comprise means for increasing the second variation rate in response to the detection of the time-out.

In an embodiment of the disclosure the switching system may comprise means for maintaining the control signal at the transfer value during a settling stage of the preliminary switching preceding the first stage.

One embodiment of the present disclosure provides a control logic circuit for use in this switching system.

One embodiment of the present disclosure provides an ignition system of a combustion engine comprising this switching system.

One embodiment of the present disclosure provides a combustion engine comprising this ignition system.

One embodiment of the present disclosure provides a vehicle comprising this combustion engine.

One embodiment of the present disclosure provides a method for switching a switching device in an ignition system of a combustion engine between an accumulation condition for accumulating energy in a first portion of the ignition system and a transfer condition for transferring said energy from the first portion of the ignition system to a second portion of the ignition system to activate at least one ignition element of the combustion engine. The method comprises: providing a control signal for controlling the switching device, the control signal varying between a transfer value corresponding to the transfer condition and an accumulation value corresponding to the accumulation condition; measuring a progress indicator indicative of a progress of a preliminary switching of the switching device from the transfer condition to the accumulation condition, and causing the control signal to vary with a first variation rate during a first stage of the preliminary switching until the progress indicator reaches a first value indicative of a first progress condition of the preliminary switching following the accumulation condition.

The method further comprises: causing the control signal to vary with a second variation rate lower than the first variation rate during a second stage of the preliminary switching following the first stage until the progress indicator reaches a second value indicative of a second progress condition of the preliminary switching following the first progress condition, and causing the control signal to vary with a third variation rate higher than the second variation rate during a third stage of the preliminary switching following the second stage.

BRIEF DESCRIPTION OF THE SEVERAL VIEWS OF THE DRAWINGS

A solution according to one or more embodiments of the disclosure, as well as additional features and its advantages, will be better understood with reference to the following detailed description of an embodiment thereof, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION

Figure 1:
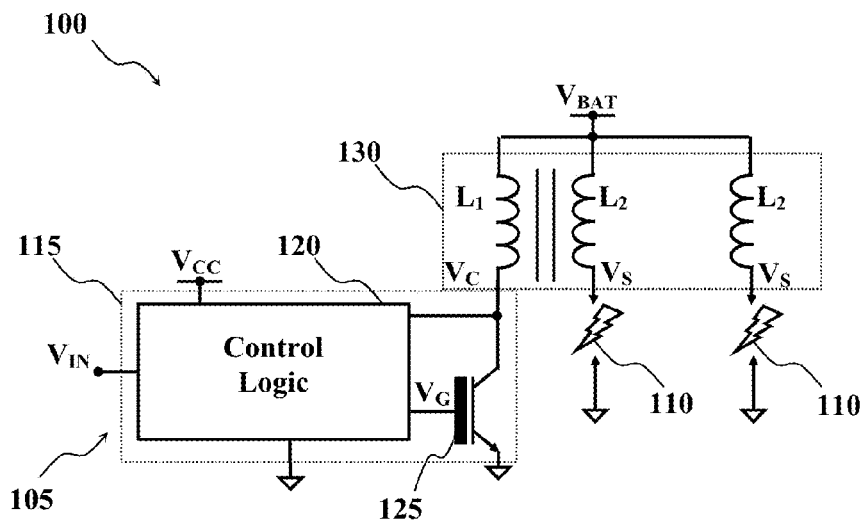
FIG. 1 schematically shows a portion of a combustion engine wherein a switching system according to an embodiment of the present disclosure may be applied.

With reference in particular to the FIG. 1, a portion of a known combustion engine 100 (for example, for automotive applications) is shown. The combustion engine 100 comprises an electronic ignition system 105, which is used to control the firing of ignition sparks in one or more spark plugs 110 (two in the drawing) of the combustion engine 100.

The ignition system 105 is based on a switching system 115, which comprises a control logic circuit 120 and a switching device, such as an IGBT 125, controlled by the control logic 120. In detail, the control logic 120 is supplied by a reference (or ground) voltage and a supply voltage $V_{CC}$ (typically, 5V with respect to the ground voltage. In another embodiment, the control logic 120 is directly supplied with battery voltage (6-18V) and includes an internal voltage regulator (not shown) configured to generate Vcc=5. The control logic 120 receives a switching command $V_{IN}$, which in the example is a logical signal that may be asserted at the supply voltage $V_{CC}$ (this voltage could be 3.3V or 5V depending on the supply voltage of the ECU and independently of supply voltage of control logic, which could be at battery voltage) or de-asserted at the ground voltage; the switching command $V_{IN}$ is for example provided by an Engine Control Unit (ECU) not shown in the drawing. The control logic 120 generates a control signal that is supplied to a gate terminal of the IGBT 125. In the example at issue the control signal is a control voltage $V_G$ for controlling the IGBT 125 according to the switching signal $V_{IN}$. The IGBT 125 also comprises a first conduction (emitter) terminal that is connected to the ground terminal. The control logic 120 has an input connected to a second conduction (collector) terminal of the IGBT 125 for measuring its collector-emitter voltage.

The ignition system 105 also comprises a transformer 130 having a primary winding $L_1$ and one or more secondary windings $L_2$ (each one for a corresponding spark plug 110—two in the example at issue). The windings $L_1$ and $L_2$ have first terminals thereof connected together for receiving a battery voltage $V_{BAT}$ (for example, 12V with respect to the ground voltage) provided by a battery (e.g., a vehicle battery, not shown in the drawing). A second terminal of the primary winding $L_1$ is connected to the collector terminal of the IGBT 125. A second terminal of each secondary winding $L_2$ is coupled with a terminal of the respective spark plug 110, whose other terminal is connected to the ground terminal.

Figure 2:
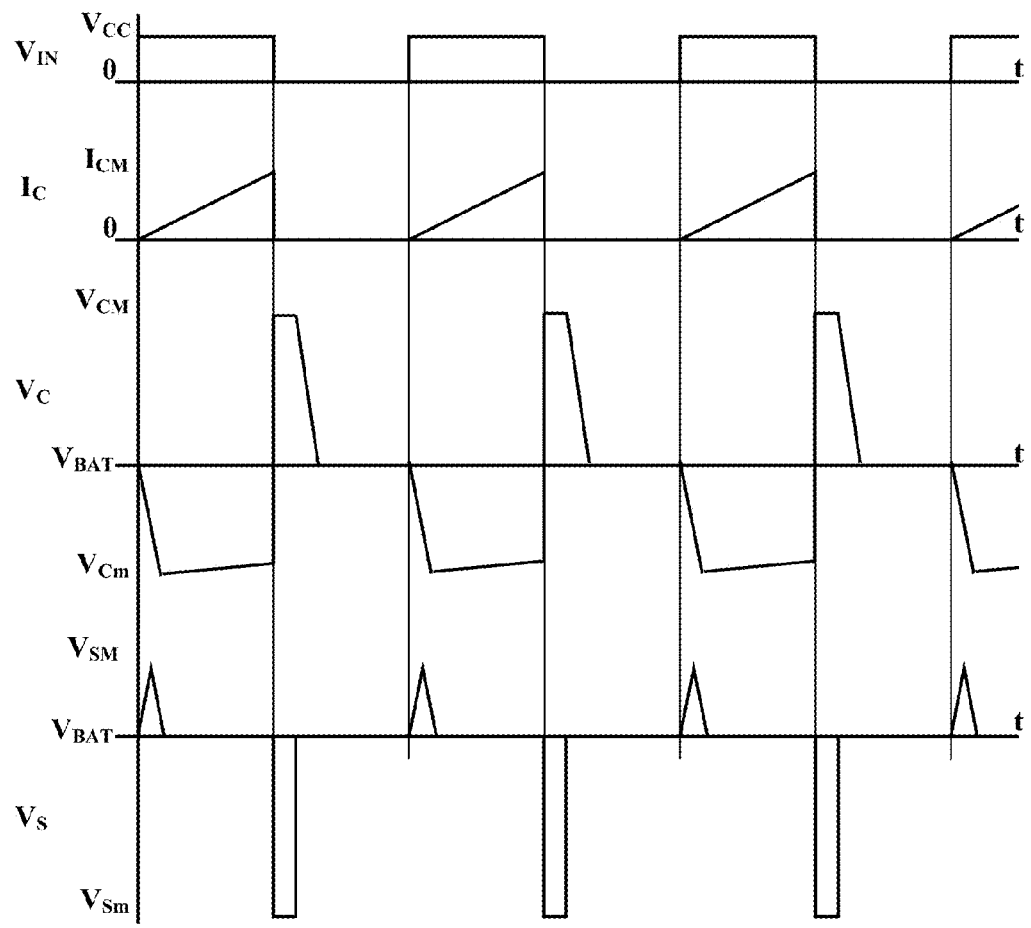
FIG. 2 schematically shows trends versus time of operating voltages and currents of the ignition system of FIG. 1 with a switching system known in the art.

The operation of the combustion engine 100 with the switching system 115 known in the art will now be described with reference to the FIG. 1 together with the FIG. 2, which schematically shows trends versus time of operating voltages and currents of the ignition system 105. When the switching command $V_{IN}$ is de-asserted (e.g., to the ground voltage), the control voltage $V_G$ has a low value. In these conditions, the high voltage clamp (Zener diode Z) connected between the collector and gate of the IGBT 125 injects current to discharge resistor $R_{GD}$, keeping the IGBT alive just to carry the primary coil current from the current value linearly to zero, so, in case of open secondary or during the spark firing, VG is not at ground. In this condition, an output voltage $V_C$ (at the collector terminal of the IGBT 125) has a value roughly equal to the value of the battery voltage $V_{BAT}$. Some time before the firing of an ignition spark (for igniting the combustion engine), the switching command $V_{IN}$ is asserted (e.g., at the supply voltage $V_{CC}$ (Again, VCC could be the supply voltage if the control logic 120 is supplied at 5V or the output of an internal voltage regulator at 5V if the control logic 120 is supplied at 12V)); as a consequence, the control voltage $V_G$ is brought to a high value (for example, equal to $V_{CC}$), so that the IGBT 125 is turned on. In this condition, the collector voltage $V_C$ rapidly drops to a low value $V_{Cm}$ roughly equal to a saturation voltage value for the IGBT 125 (which normally is around 1.5V). Accordingly, a primary voltage across the primary winding $L_1$ of the transformer 130 increases to a value near to the value of the battery voltage $V_{BAT}$–Vcm; a charging current $I_C$ having a linear pattern then flows through the primary winding $L_1$ so as to store energy therein. Subsequently, the switching command $V_{IN}$ switches back to the low value, thereby causing an abrupt cut of the charging current $I_C$ (i.e., a current slope $\Delta I_C/\Delta t$ of the charging current $I_C$ assumes a very high value). In response, the output voltage $V_C$ rises and an extra-voltage [equal to high voltage clamp Zener Z] develops across the primary winding $L_1$, with a corresponding very low voltage value $V_{Sm}$ across each secondary winding $L_2$ that transfers the energy previously stored in the primary winding $L_1$ to the secondary windings $L_2$ and therefrom to the spark plugs 110, which ignite.

Unfortunately, also when the output voltage $V_C$ rapidly drops to the low voltage value $V_{Cm}$ (i.e., with a voltage slope $\Delta V_C/\Delta t$ having a very high value), a corresponding secondary voltage $V_S$ appears at each secondary winding $L_2$. In detail, the secondary voltage $V_S$ reaches a voltage value $V_{SM}$ that may provoke an unwanted activation of the spark plugs 110, which may lower the efficiency of the engine or even damage the mechanical parts located, together with a respective one of the spark plugs 110, in a corresponding combustion chamber (not shown in the figures) of the combustion engine 100.

Figure 3:
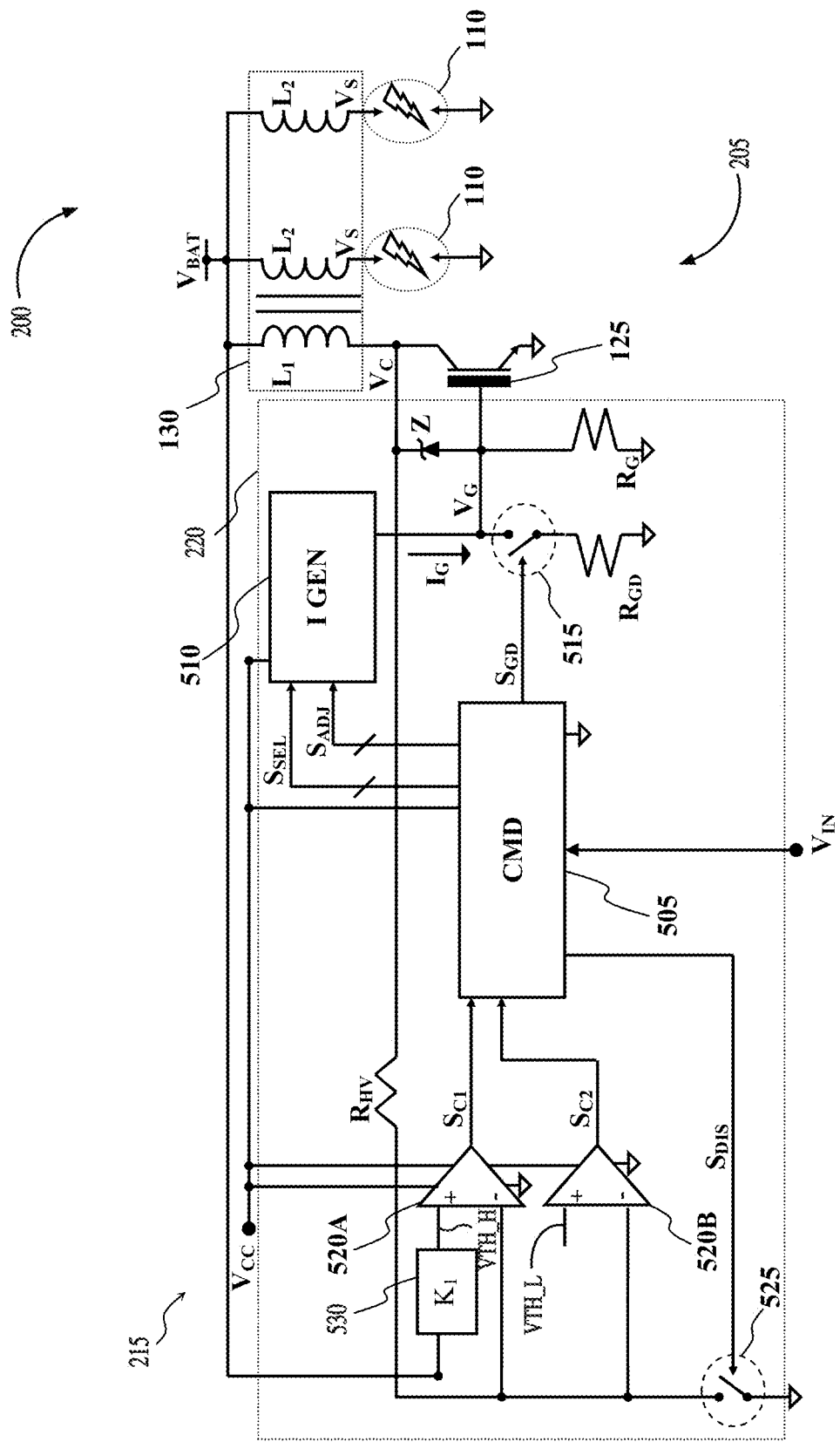
FIG. 3 shows a principle circuit schematic of a switching system according to an embodiment of the present disclosure.

FIG. 3 shows a principle circuit schematic of an ignition system 205 of a combustion engine 200 according to an embodiment of the present disclosure. The ignition system 205 includes the spark plugs 110 and transformer 130 as in the prior art device shown in FIG. 1, together with a switching system 215 according to one embodiment of the present disclosure. The switching system 215 includes a switch 125, such as the IGBT shown in FIG. 1, together with a control circuit 220 according to one embodiment of the present disclosure.

The control circuit 220 includes a command block 505, supplied between the ground voltage and the supply voltage $V_{CC}$, and variable current generator 510. The command block 505 receives the switching command $V_{IN}$ and provides to the current generator 510 a selection signal $S_{SEL}$ (e.g., a two binary digit logic signal) and an adjustment signal $S_{ADJ}$ (e.g., of thermometric code type) for determining a value of a gate current $I_G$ generated by the current generator 510 (as will be discussed in greater detail below). The current generator 510 is supplied by the supply voltage $V_{CC}$ and is connected to the gate terminal of the IGBT 125, to which are also connected a first terminal of a gate resistor $R_G$ and a first terminal of a zener diode Z. A second terminal of the gate resistor $R_G$ is connected to a reference terminal receiving the ground voltage. A second terminal of the zener diode Z is connected to the collector terminal of the IGBT 125. The IGBT gate terminal is also selectively connectable to a first terminal of a gate discharge resistor $R_{GD}$ by a first discharge switch 515 (e.g., a MOS transistor). A second terminal of the gate discharge resistor $R_{GD}$ is connected to the reference terminal kept at the ground voltage. The first discharge switch 515 is controlled by a gate discharge signal $S_{GD}$ provided by the command block 505 (as will be discussed in greater detail below).

A high-voltage resistor $R_{HV}$ has a first terminal electrically coupled to the collector terminal of the IGBT 125 and a second terminal electrically coupled to inverting terminals of first and a second comparators 520A and 520B, respectively. A second discharge switch 525 (e.g., a MOS transistor) selectively electrically couples the second terminal of the high-voltage resistor $R_{HV}$ to the ground reference terminal. The second discharge switch 525 is controlled by a discharge signal $S_{DIS}$ provided by the command block 505. A proportionality block 530 receives at an input terminal the battery voltage $V_{BAT}$ and has an output terminal electrically coupled to a non-inverting terminal of the comparator 520A. Particularly, the proportionality block 530 multiplies the battery voltage $V_{BAT}$ by a predetermined constant $K_1$, lower than one (e.g., K1=0.9, i.e. 90% of $V_{BAT}$) to obtain a high threshold voltage VTH_H. The second comparator 520B receives a low threshold voltage VTH_L that is normally set a little higher than Vcm (Vcm+$\Delta$V, with $\Delta$V=1V for example) independently of VBAT, but lower than VTH_H. Finally, the output terminals of the comparators 520A and 520B are electrically coupled to inputs of the command block 505 and provide first and second comparator signals $S_{C1}$ and $S_{C2}$, respectively (as will be described in greater detail in the following).

Figure 4A:
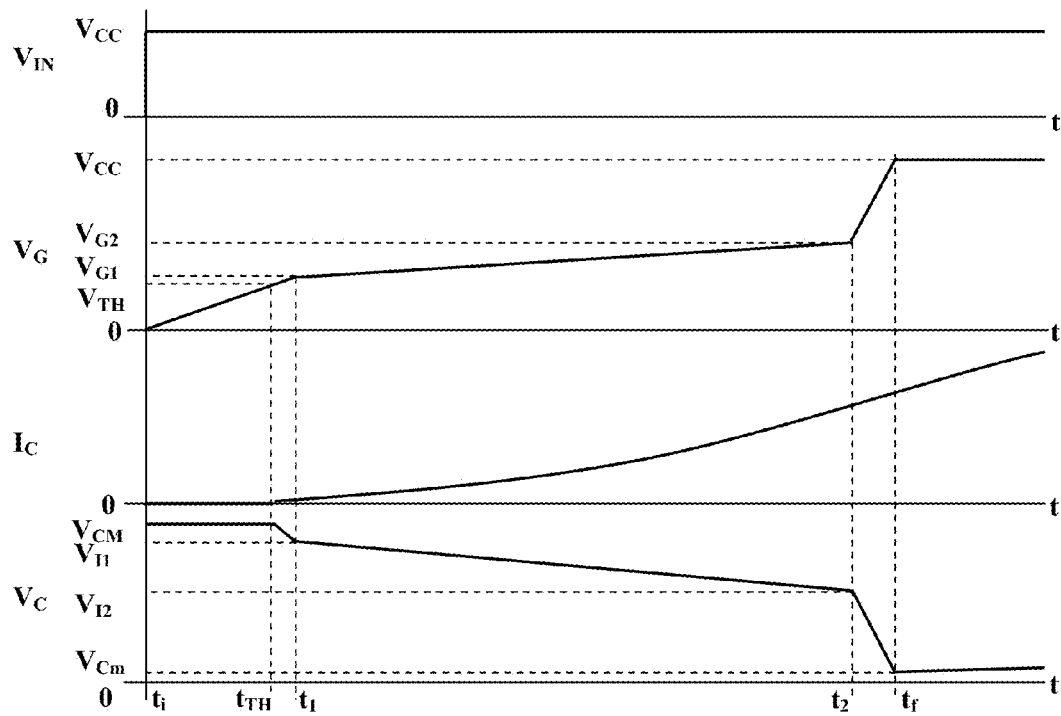
FIG. 4A schematically shows trends versus time of operating voltages and currents of the electronic ignition system of FIG. 1 with a switching system according to an embodiment of the present disclosure.

Turning now to FIG. 4A, in which trends versus time of operating voltages and currents of the electronic ignition system 205 with the switching system 215 according to an embodiment of the present disclosure are schematically shown, and still referring to FIG. 1, an operation of the switching system 215 according to an embodiment of the disclosure will be now described.

In one embodiment of the present disclosure, the control circuit 220 is configured for generating a variable control voltage $V_G$ that is provided to the gate of the IGBT 125 to control the IGBT. The value of the control voltage $V_G$ is related to the value taken by the output voltage $V_C$, and in this way it is possible to prevent any unwanted activation of the spark plugs 110, as will become apparent from the following description.

Starting from an assertion of the switching command $V_{IN}$, for example, from the low value (the ground voltage) to the high value (the supply voltage $V_{CC}$), until a final time instant $t_f$—a period of time that, from now on, will be referred to as "preliminary switching" for sake of conciseness—, the control circuit 220 causes the control voltage $V_G$ to vary with a first, a second and a third variation rate during a first, a second and a third stages, respectively of the preliminary switching.

In more detail, the control circuit 220 causes the control voltage $V_G$ to vary with the first variation rate during the first stage from an initial instant t, to a first intermediate instant $t_1$ of the preliminary switching until the output voltage $V_C$ reaches a first intermediate voltage value $V_{f1}$ preferably, although not limitatively, equal to 90% of the initial value of the output voltage $V_C$ (i.e., the battery voltage $V_{BAT}$).

During the first stage, a conduction condition of the IGBT 125 is initiated when the control voltage $V_G$ rises to values above a threshold voltage value $V_{TH}$ for the IGBT 125. In particular, the first variation rate of the control voltage $V_G$ causes a charging current $I_C$ to flow through the IGBT 125. Such charging current $I_C$, flowing through the IGBT 125, increases very slowly during the preliminary switching, following a roughly parabolic pattern. Therefore, when the IGBT 125 is in such conduction condition, the output voltage $V_C$ drops toward the first intermediate voltage value $V_{f1}$ with a first voltage slope (which is a negative slope).

When the output voltage $V_C$ reaches the first intermediate value $V_{f1}$, the second stage (from the first intermediate instant $t_1$ to a second intermediate instant $t_2$) starts, in which the control circuit 220 causes the control voltage $V_G$ to vary with the second variation rate lower than the first variation rate of the first stage until the output voltage $V_C$ reaches a second intermediate value $V_{f2}$, which is higher (preferably by a little) than the saturation voltage Vcm of the IGBT 125.

The output voltage $V_C$ thus drops to the second intermediate voltage value $V_{f2}$ with a second (negative) voltage slope. In particular, the second control voltage $V_G$ is selected in such a way that the corresponding second voltage slope of the output voltage $V_C$ prevents any unwanted activation of the spark plugs 110 during the preliminary switching of the switching system 115.

Once the output voltage $V_C$ has reached the second intermediate value $V_{f2}$, the control logic 120 causes the control voltage $V_G$ to vary with the third variation rate higher than the second variation rate—and, preferably, higher than the first variation rate—during the third stage (from the second intermediate instant $t_2$ to a final intermediate instant $t_f$) of the preliminary switching following the second stage.

In the third stage, the third variation rate is designed in such a way to fully complete the charge of the IGBT gate. Thus, it is possible to quickly bring the control voltage $V_C$ to the minimum voltage value $V_{Cm}$ (corresponding to the saturation voltage value of the IGBT 125), thereby quickly completing an energizing of the primary winding $L_1$ through the charging current $I_C$ without provoking any unwanted activation of the spark plugs 110. This result is achieved by selecting the second intermediate voltage value $V_{f2}$ low enough to prevent any appearance of secondary voltages $V_S$ across the secondary windings $L_2$ with a sufficiently high voltage value that would provoke an unwanted activation of the spark plugs 110.

With the switching system according to the described embodiment of the present disclosure it is possible to control both the voltage the current across the conduction terminals (i.e., the collector and emitter terminals) of the IGBT by measuring an indicator of the progress of the charging of the primary winding, such progress indicator being for example the output voltage Vc of the switching system 215. This allows preventing unwanted extra-voltages across the primary winding, which results in an overshoot voltage across the secondary windings that may cause undesired activations of the spark plugs. The lowering of the efficiency of the engine or even the damaging of its mechanical parts is thus prevented.

Figure 4B:
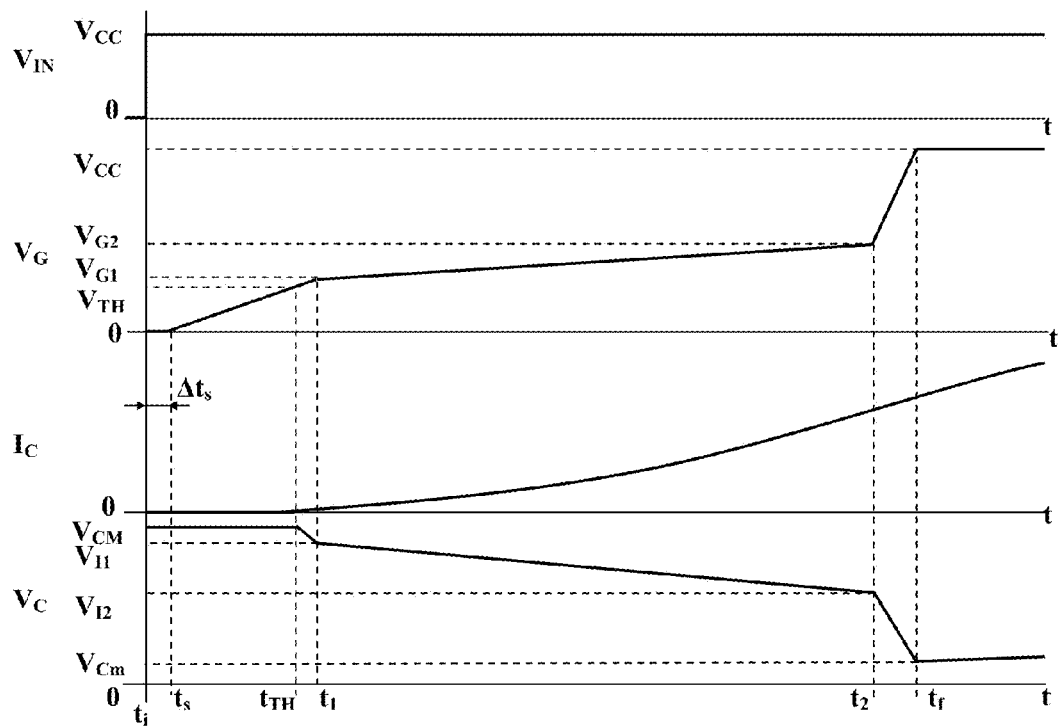
FIG. 4B schematically shows trends versus time of operating voltages and currents of the electronic ignition system of FIG. 1 with a switching system according to another embodiment of the present disclosure.

The operation of the switching system 215 according to another embodiment of the present disclosure will be described making now reference to FIG. 3 together with FIG. 4B, wherein trends versus time of operating voltages and currents of the electronic ignition system 205 is schematically illustrated.

In particular, the operation of the switching system 215 differs from the operation just described in what follows.

A settling time period $\Delta t$ (from the initial instant $t_i$ to a settling instant $t_s$) is waited before causing the control voltage $V_G$ to vary with the first variation rate during the first stage. The settling time period $\Delta t_s$ grants a safe and correct acquisition of an initial value of the output voltage $V_C$ (substantially, a value equal to the value of the battery voltage $V_{BAT}$) at the end of the transfer condition by the control logic 120, even in the case of changes in the value of the battery voltage $V_{BAT}$ (such as temporary reductions caused by peak power absorption from the battery).

Figure 5:
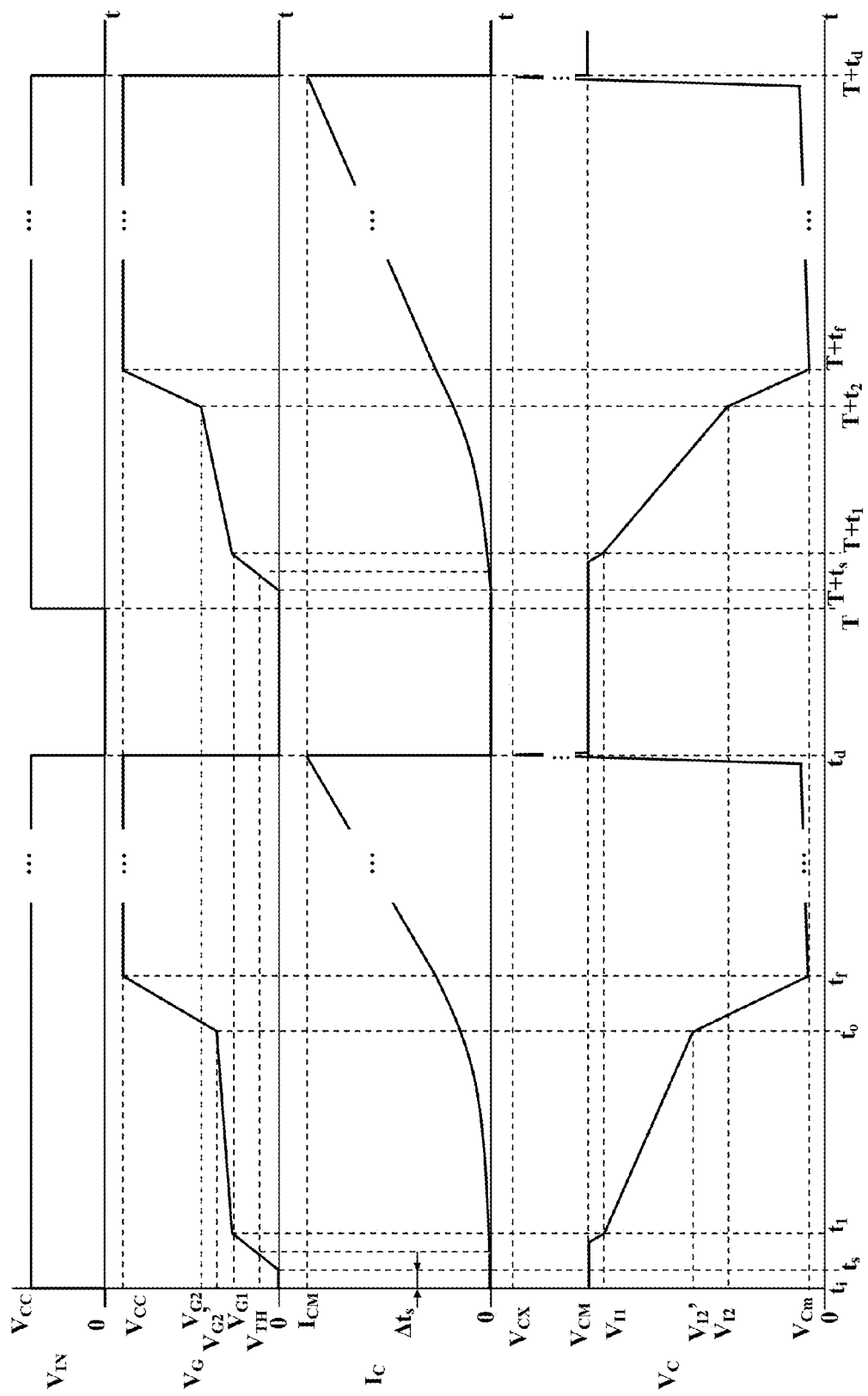
FIG. 5 schematically shows trends versus time of operating voltages and currents of the electronic ignition system of FIG. 1 with a switching system according to a still further embodiment of the present disclosure.

In FIG. 5, there are schematically shown trends versus time of operating voltages of the combustion engine 200 of FIG. 3 implementing the switching system 215 according to an another embodiment of the present disclosure.

The operation of the switching system 215 differs from the operation of the switching systems previously described in that a self-adjustment of the accumulation condition is provided. In more detail, the control logic 220 checks if a duration of the second stage exceeds a predetermined time-out. The control logic 120 measures a duration of the second stage (e.g., by means of a counter—not shown) from the first intermediate instant $t_1$ (i.e., when the second stage starts). The measure is stopped and reset when the output voltage $V_C$ reaches the second intermediate value $V_{f2}$ and it is then checked that:

$$t_2 - t_1 < \Delta t_{OUT},$$

wherein $\Delta t_{OUT}$ is the predetermined time-out. If the second stage lasts more than the time-out $\Delta t_{OUT}$, i.e. it is reached a time-out instant $t_o$ for which:

$$t_o - t_1 \geq \Delta t_{OUT},$$

the expiry of the time-out $\Delta t_{OUT}$ is detected. The expiry of the time-out $\Delta t_{OUT}$ may be provoked by variations of the parameters of the ignition system 205 due, for example, to the operating temperature of the ignition system 205 or to the aging of the IGBT 125. Therefore, in order to ensure a complete charge of the primary winding within an ignition instant $t_d$ (at which the firing of the spark plugs 110 is required), the control logic 120 causes the control voltage $V_G$ to vary with the third variation rate, forcefully starting the third stage regardless of an actual value $V_{I2}'$ taken by the output voltage $V_C$. In this way, the switching system 115 ensures that the electronic ignition system 105 is ready to activate the spark plugs 110 when needed—i.e. at the falling edge of the switching command $V_{IN}$ at instant $t_d$. The time-out $\Delta t_{OUT}'$ is preferably selected in such a way to minimize value the probability of unwanted firing of the spark plugs 110 due to the voltage drop from the actual value $V_{I2}'$ to the minimum voltage value $V_{Cm}$, while ensuring that the primary winding $L_1$ is properly charged at the ignition instant $t_d$.

In a following preliminary switching of the switching system 215 (corresponding to a following assertion of the switching signal $V_{IN}$) the second variation rate of the control voltage $V_G$ is increased by a predetermined value (the second variation rate remaining always lower than the third variation rate). This increases the absolute value of the slopes of the charging current $I_C$ and of the output voltage $V_C$; thus, in the example at issue, the output voltage $V_C$ drops faster towards the second intermediate value $V_{I2}$, and reaches it at the intermediate instant $t_2$, before the expiry if the time-out $\Delta t_{OUT}'$.

For each successive preliminary switching phase, in which the successive second stage times out again, the second variation rate of the control voltage $V_G$ will be increased again by the predetermined value (the second variation rate remaining always lower than the third variation rate). This operation is repeated until the second stage ends reaching the second intermediate value $V_{I2}$ at the intermediate instant $t_2$ before the time-out $\Delta t_{OUT}'$ expires.

Particularly, when the second variation rate is set equal to an adjusted second variation rate value (equal to an initial second variation rate of the control voltage $V_G$ plus the predetermined value multiplied by a number of times the control voltage $V_G$ has been increased, i.e. the number of time-out expiries detected by control circuit 220) that prevents the expiry of the time-out, such second adjusted variation rate value is maintained at least until the combustion engine is turned off. In this way, in the second stages of each successive preliminary switching phase, the output voltage $V_C$ will reach the intended second intermediate value $V_{I2}$ before the expiry of the time-out $\Delta t_{OUT}'$. The second variation rate may be reset after a turn-off of the combustion engine 200. Alternatively, the second variation rate may be set equal to such second adjusted variation rate value (for example, by storing it in a memory of the switching system, not shown) for every successive operation of the combustion engine 200.

In the switching system according to the described embodiment of the present disclosure, it is possible to dynamically compensate variations in the operating parameters of the IGBT (such as its threshold voltage $V_{TH}$) that are strictly related to environment conditions (such as the external temperature). Therefore, the soft turn-on of the IGBT maintains almost wholly its efficiency even if the value of its operating parameters vary with respect to the expected values according to which the soft turn-on is designed. In addition, the solution based on the present disclosure, at least partly, copes with variations of operative parameters of the whole switching system due to manufacturing process spreads and due to an aging of the IGBT, thereby at least reducing any permanent efficiency loss of its soft turn-on.

The operation of the switching system 215 will be now described considering FIG. 3 and FIG. 5 together.

While the switching command $V_{IN}$ is de-asserted the command block 505 maintains the discharge signals $S_{GD}$ and $S_{DIS}$ asserted, thus, closing the corresponding first and second switches 515 and 525, respectively. In this way, the inverting terminals of the comparators 520A and 520B receive the ground voltage (The asserted discharge signal $S_{DIS}$ also prevents the command block 505 from receiving a very high voltage during switch off of the IGBT 125); therefore, the first and second comparator signals $S_{C1}$ and $S_{C2}$ are asserted. At the same time, the IGBT 125 is maintained turned off. This is due to the gate discharge resistor $R_{GD}$, which is sized in such a way to have a resistance much lower than that of the gate resistor $R_G$. Indeed, the gate discharge resistor $R_{GD}$ is designed also in such a way that the gate current $I_G$ flowing through the gate discharge resistor $R_{GD}$ provokes a discharge voltage much lower than the threshold voltage $V_{TH}$ of the IGBT 125 (i.e., $R_{GD} \cdot I_G \ll V_{TH}$). In such conditions, the control voltage $V_C$ (at the collector terminal of the IGBT 125) is substantially equal to the battery voltage $V_{BAT}$.

When the switching command $V_{IN}$ is asserted the command block 505 de-asserts the discharge signals $S_{GD}$ and $S_{DIS}$, thus opening the corresponding first and second switches 515 and 525, respectively. Subsequently, the voltage at the inverting terminals of the comparators 520A and 520B starts rising until it reaches the voltage value of the output voltage $V_C$ (substantially equal to the battery voltage $V_{BAT}$) after the settling period $\Delta t_s$. Therefore, at the settling time $t_s$ both the first and the second comparator signals $S_{C1}$ and $S_{C2}$ are de-asserted (for example, at the ground voltage) since:

$$V_{BAT} > K_1 \cdot V_{BAT}, V_{Cm} + \Delta V.$$

In such condition, the command block 505 provides to the current generator 510 the selection signal $S_{SEL}$ having a first value. In response, the current generator 510 generates a gate current $I_G$ having a first value, which flows through the gate resistor $R_G$ and into the gate of the IGBT 125—charging a gate capacitance of the IGBT 125, not shown in the figures. The control voltage $V_G$ thus rises with the first variation rate that is proportional to the first value of the gate current $I_G$ divided by the IGBT gate capacitance. When the gate voltage $V_G$ reaches the threshold voltage value $V_{TH}$ of the IGBT 125, the IGBT 125 enters the conduction condition; the charging current $I_C$ starts to flow and the output voltage $V_C$ falls according to the first voltage slope. At the first intermediate instant $t_1$, the output voltage $V_C$ reaches the first intermediate voltage value $V_{I1}$, which is equal (or lower) than the value $K_1 \cdot V_{BAT}$ (for example, set equal to 90% $V_{BAT}$ as previously described). Therefore, the first comparator 520A asserts the first comparator signal $S_{C1}$. The assertion of the first comparator signal $S_{C1}$ provokes the command block 505 to vary the selection signal $S_{SEL}$ to a second value, which causes the current generator 510 to provide the gate current $I_G$ with a second value. From the instant $t_1$, the control voltage $V_G$ then rises with the second variation rate (proportional to the second value of the gate current $I_G$ divided by the IGBT gate capacitance) and the time counter (not shown the figures) in the command block 505 is activated. The charging current $I_C$ flowing through the IGBT 125 slowly increases and the output voltage $V_C$ falls accordingly with the second voltage slope. At a time-out instant $t_o$ the time counter detects the expiry of the time-out of the second stage. Therefore, the command block 505 varies the selection signal $S_{SEL}$ to a third value, which causes the value of the gate current $I_G$ to take a third value. From the time-out instant $t_o$, the control voltage $V_G$ then rises with the third variation rate (proportional to the third value of the gate current $I_G$ divided by the IGBT gate capacitance) and the time counter in the command block 505 is reset. The output voltage $V_C$ quickly falls with the third voltage slope. At the final instant $t_f$ the control voltage $V_G$ reaches the supply voltage $V_{CC}$ and the output voltage $V_C$ reaches the minimum value $V_{Cm}$ (i.e., the saturation value of the IGBT 125). The charging current $I_C$, from now on, continues to flow with an approximately linearly increasing trend, reaching its maximum value $V_{CM}$ at the ignition instant td, while the output voltage $V_C$ experiences a little rise from its minimum value $V_{Cm}$ (as known to those skilled in the art). At the ignition instant td the switching command $V_{IN}$ is de-asserted and the command block 505 asserts the discharge signals $S_{DIS}$ and $S_{GD}$. The assertion of the discharge signals $S_{GD}$ and $S_{DIS}$ causes the first and second discharge switches 515 and 525, respectively, to close; the closure of the switch 515 causes the abrupt discharge of the gate terminal of the IGBT 125, while the closure of switch 525 discharges the inverting terminals of the comparators 520A and 520B to the ground voltage. At the same time, the output voltage $V_C$ rapidly rises above the battery voltage $V_{BAT}$—due to the energy stored in the primary winding $L_1$ of the transformer 130—up to an extra value $V_X$ (in the order of hundreds of volts) sufficient to cause—thanks to the winding ratio of the transformer—the secondary voltage $V_S$ to reach a value sufficient to fire the spark plugs 110. The zener diode Z is activated when the output voltage reaches the extra voltage $V_X$; the zener diode Z has the purpose of rapidly discharging the primary winding $L_{1i}$ until the output voltage $V_C$ is brought back to its initial value, which is substantially equal to the battery voltage $V_{BAT}$.

At the instant T the switching command $V_{IN}$ is asserted again and the above-described operation is repeated (in order to provide another firing of the spark plugs 110) with the following differences.

When the first comparator signal $S_{C1}$ is asserted (at an instant $T+t_1$), the command block 505, along with provoking the selection signal $S_{SEL}$ to vary to a second value, sets the adjust signal $S_{ADJ}$ to a first adjustment value. Thus, the current generator 510 provides the gate current $I_G$ with a second adjusted value, which is higher than the previous second value. From the instant $T+t_1$, the control voltage $V_G$ then rises with the second variation rate equal to the adjusted second variation rate value (proportional to the second adjusted value of the gate current $I_G$ divided by the IGBT gate capacitance), which is greater than the previous second variation rate, and the time counter in the command block 505 is activated again. The charging current $I_C$ flowing through the IGBT 125 continues to increase and the output voltage $V_C$ falls according to the second adjusted voltage slope (higher than the second voltage slope). At the instant $T+t_2$ the time counter has not yet reached the time-out $\Delta t_{OUT}$ of the second stage, but the output voltage $V_C$ has reached a value equal to, or lower than, $-Vcm+\Delta V$ (e.g. Vcm+1V), which causes the second comparator 520B to assert the second comparator signal $S_{C2}$. In response, the command block 505 varies the selection signal $S_{SEL}$ to the third value, which causes the current generator 510 to provide the gate current $I_G$ with the third current value. From the instant $T+t_2$, the control voltage $V_G$ then rises with the third variation rate (proportional to the third value of the gate current $I_G$ divided by the IGBT gate capacitance) and the time counter in the command block 505 is reset anew. Therefore, the output voltage $V_C$ falls according to the third voltage slope of the control voltage $V_G$, until it reaches the minimum value $V_{Cm}$ at the instant $T+t_f$. Afterwards, the operation of the switching system 115 proceeds as previously described, i.e. with the primary winding $L_1$ that is energized until the ignition instant $t_d$ and then the energy is transferred to the secondary windings $L_2$ (by de-asserting the switching command $V_{IN}$), thus igniting the spark plugs 110.

Figure 6A:
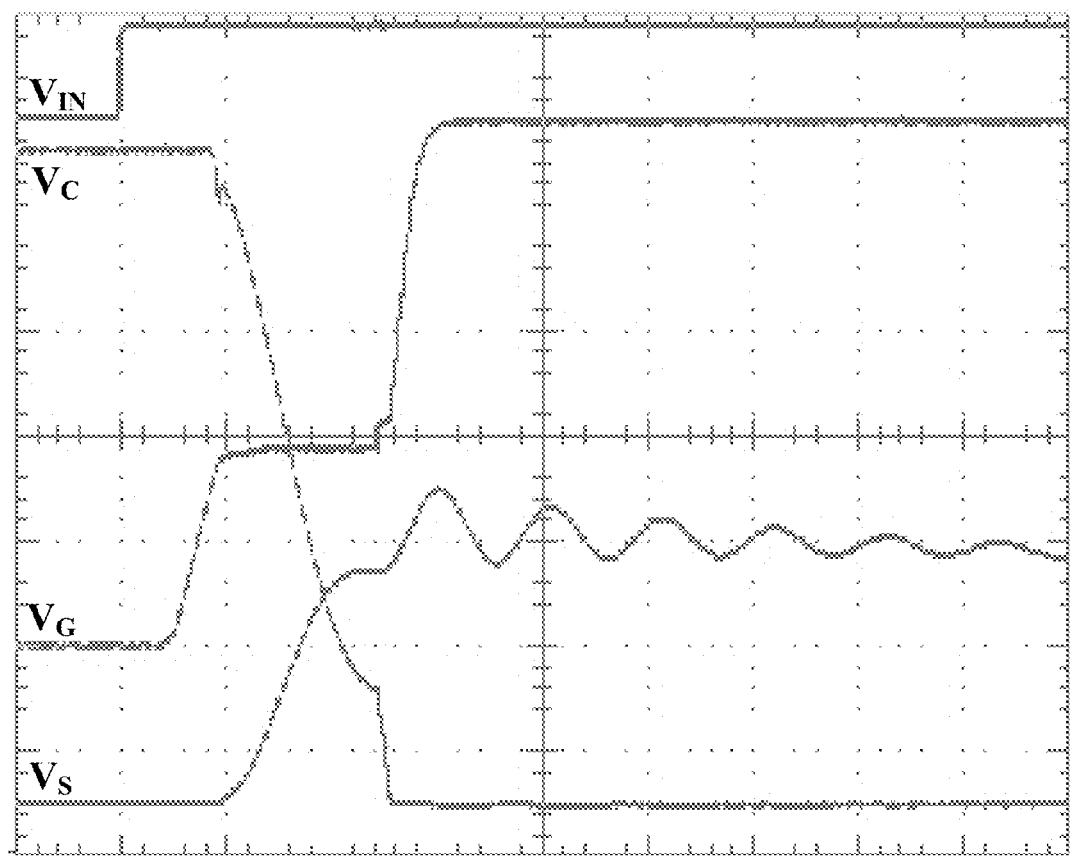
FIG. 6A shows experimental results of an electronic ignition engine with a switching system according to an embodiment of the present disclosure.
Figure 6B:
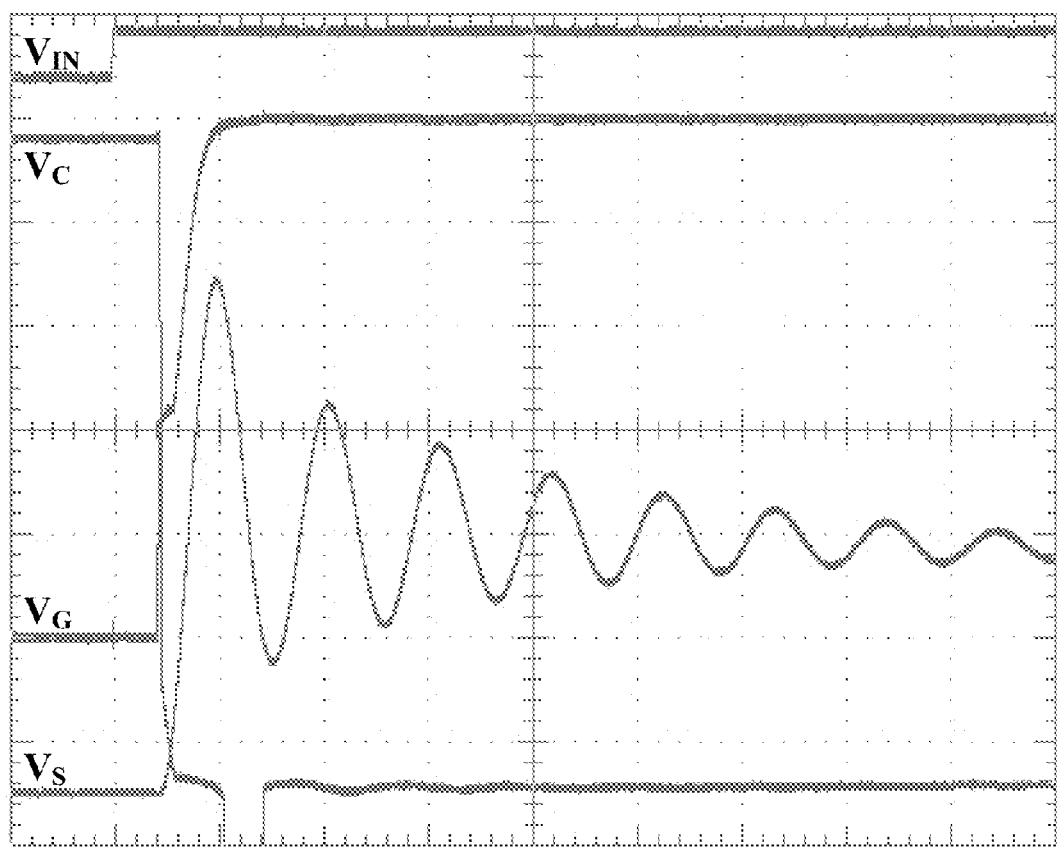
FIG. 6B shows experimental results of an electronic ignition engine with a switching system according to a solution known in the art.

With joint reference to FIG. 6A and to FIG. 6B, which show experimental results of an electronic ignition engine with a switching system according to an embodiment of the present disclosure and of an electronic ignition engine with a switching system according to a solution known in the art, respectively, the effectiveness of the solution according to the present disclosure may be inferred.

It should be noted that the voltages plotted in both FIG. 6A and FIG. 6B are not to scale with respect to each other.

In particular, it can be appreciated that the output voltage $V_C$ in FIG. 6A drops substantially smoothly and with a relatively low slope (i.e., with a low voltage slope) towards its minimum value, while in FIG. 6B the output voltage $V_C$ drops abruptly towards its minimum value and experience an extra voltage drop due to the abrupt changes in the working parameters (current and voltage) of the transformer. As can be seen in FIG. 6B, the abrupt drop of the control voltage $V_C$ give rise to a secondary voltage $V_S$ with ample oscillations and that reaches a maximum voltage value (e.g., in the order of the kilovolts) very likely to provoke unwanted firing of the spark plugs. Conversely, in the experimental results of FIG. 6A the secondary voltage $V_s$ has an oscillation with reduced amplitude compared to that of FIG. 6B, and which also fades out faster.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the disclosure may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

For example, similar considerations apply if the switching system has a different architecture or includes equivalent components (either separated or combined, in whole or in part); in addition, the switching system may have different operating characteristics, such as a control signal having more than three variation rates.

Nothing prevents the switching device from having more than two conduction terminals.

The switching system may be able to provide more than three values for the control current.

Nothing prevents the switching system from being in a transfer condition when the switching device is in a closed condition and, vice versa, to be in an accumulation condition when the switching device is in an open condition.

The switching system may have different first and second values of the progress indicator, for example, based on different fractions of a difference between the initial and the final value of the progress indicator.

The switching system may force the control signal to vary with a variation rate different from the third variation rate upon detection of the time-out expiration.

Nothing prevents the switching system from varying the value of the control signal during the settling stage.

The proposed solution is adapted to be implemented by an equivalent method (using similar steps, removing some steps being not essential, or adding further optional steps); moreover, the steps may be performed in different order, in parallel or overlapped (at least in part).

It should be readily apparent that the proposed solution might be part of the design of an integrated device. The design may also be created in a programming language; in addition, if the designer does not manufacture the integrated device or its masks, the design may be transmitted through physical means to others. Anyway, the resulting integrated device may be distributed by its manufacturer in the form of a raw wafer, as a naked chip, or in packages.

Moreover, the solution may be integrated with other circuits in a same chip, or it may be mounted in intermediate products (such as electronic boards) and coupled with one or more other chips (such as an engine control unit). In any case, the solution is adapted to be used in complex systems (such as automotive).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A switching system for use in an ignition system of a combustion engine, the switching system comprising:
    a switching device configured to switch between an accumulation condition for accumulating energy in a first portion of the ignition system and a transfer condition for transferring said energy from the first portion of the ignition system to a second portion of the ignition system to activate at least one ignition element of the combustion engine; and
    a control logic circuit configured to control the switching device, the control logic circuit including:
        means for providing a control signal for controlling the switching device, the control signal varying between a transfer value corresponding to the transfer condition and an accumulation value corresponding to the accumulation condition,
        means for measuring a progress indicator indicative of a progress of a preliminary switching of the switching device from the transfer condition to the accumulation condition,
        means for causing the control signal to vary with a first variation rate during a first stage of the preliminary switching until the progress indicator reaches a first value indicative of a first progress condition of the preliminary switching following the accumulation condition,
        means for causing the control signal to vary with a second variation rate lower than the first variation rate during a second stage of the preliminary switching following the first stage until the progress indicator reaches a second value indicative of a second progress condition of the preliminary switching following the first progress condition, and
        means for causing the control signal to vary with a third variation rate higher than the second variation rate during a third stage of the preliminary switching following the second stage.

2. The switching system according to claim 1, wherein the third variation rate is higher than the first variation rate.

3. The switching system according to claim 1, wherein the switching device has a first conduction terminal and a second conduction terminal for connection in the ignition system, the progress indicator being an operative voltage of the switching device at one of the first and second conduction terminals.

4. The switching system according to claim 1, wherein the switching device has a control terminal for receiving the control signal, the control signal being a control voltage, and wherein the means for providing the control signal comprises:
    means for generating the control voltage from a control current, and
    means for setting the control current selectively to a first amplitude, a second amplitude or a third amplitude corresponding to the first variation rate, the second variation rate or the third variation rate, respectively.

5. The switching system according to claim 1, wherein the transfer condition is an open condition of the switching device and the accumulation condition is a closed condition of the switching device.

6. The switching system according to claim 1, wherein the progress indicator has an initial value in the transfer condition and a final value in the accumulation condition, a difference between the first value and the final value being comprised between 85-95% of a difference between the initial value and the final value, and a difference between the second value and the final value being lower than 50% of the difference between the initial value and the final value.

7. The switching system according to claim 1, wherein the control logic circuit includes:
    means for detecting a time-out at which a duration of the second stage reaches a duration threshold, and
    means for forcing the control signal to vary with the third variation rate in response to detecting the time-out.

8. The switching system according to claim 7, wherein the control logic circuit includes:
    means for increasing the second variation rate in response to detecting the time-out.

9. The switching system according to claim 1, wherein the control logic circuit includes:
    means for maintaining the control signal at the transfer value during a settling stage of the preliminary switching preceding the first stage.

10. A control circuit for controlling a switching device of an ignition system of an internal combustion engine, the control circuit comprising:
    a first comparator configured to compare an output voltage of the switching device with a first threshold and provide a first threshold signal in response to detecting that the output voltage has reached the first threshold;
    a second comparator configured to compare the output voltage of the switching device with a second threshold and provide a second threshold signal in response to detecting that the output voltage has reached the second threshold; and
    a controller coupled to the first and second comparators and configured to:
        control the switching device with a control signal that varies between a transfer value and an accumulation value;
        cause the control signal to increase with a first variation rate during a first switching stage;
        cause the control signal to increase with a second variation rate, lower than the first variation rate, during a second switching stage in response to the first threshold signal, and
        cause the control signal to increase with a third variation rate, higher than the second variation rate, during a third switching stage in response to the second threshold signal.

11. The control circuit according to claim 10, wherein the third variation rate is higher than the first variation rate.

12. The control circuit according to claim 10, wherein the controller includes:
a variable current generator configured to selectively generate a control current at a first amplitude corresponding to the first variation rate, a second amplitude corresponding to the second variation rate, and a third amplitude corresponding to the third variation rate; and
a logic circuit electrically coupled to the first and second comparators and the variable current generator and configured to control the variable current generator based on the first and second threshold signals.

13. The control circuit according to claim 10, wherein the controller includes:
a timer configured to detect a time-out at which a duration of the second stage reaches a duration threshold, wherein the controller is configured to force the control signal to increase with the third variation rate in response to the timer indicating that the time-out has been detected.

14. The control circuit according to claim 13, wherein the controller is configured to increase the second variation rate in response to the timer indicating that the time-out has been detected.

15. The control circuit according to claim 10, further comprising:
a multiplier having an input and an output, the first multiplier being configured to receive at the input a battery voltage for driving the ignition system and produce at the output the first threshold signal based a multiplication of the battery voltage and a proportionality constant.

16. An ignition system of an internal combustion engine, the ignition system comprising:
a switching device; and
control circuit configured to control the switching device, the control circuit including:
a first comparator configured to compare an output voltage of the switching device with a first threshold and provide a first threshold signal in response to detecting that the output voltage has reached the first threshold;
a second comparator configured to compare the output voltage of the switching device with a second threshold and provide a second threshold signal in response to detecting that the output voltage has reached the second threshold; and
a controller coupled to the first and second comparators and configured to:
control the switching device with a control signal that varies between a transfer value and an accumulation value;
cause the control signal to increase with a first variation rate during a first switching stage;
cause the control signal to increase with a second variation rate, lower than the first variation rate, during a second switching stage in response to the first threshold signal, and
cause the control signal to increase with a third variation rate, higher than the second variation rate, during a third switching stage in response to the second threshold signal.

17. The ignition system according to claim 16, wherein the third variation rate is higher than the first variation rate.

18. The ignition system according to claim 16, wherein the controller includes:
a variable current generator configured to selectively generate a control current at a first amplitude corresponding to the first variation rate, a second amplitude corresponding to the second variation rate, and a third amplitude corresponding to the third variation rate; and
a logic circuit electrically coupled to the first and second comparators and the variable current generator and configured to control the variable current generator based on the first and second threshold signals.

19. The ignition system according to claim 16, wherein the controller includes:
a timer configured to detect a time-out at which a duration of the second stage reaches a duration threshold, wherein the controller is configured to force the control signal to increase with the third variation rate in response to the timer indicating that the time-out has been detected.

20. The ignition system according to claim 19, wherein the controller is configured to increase the second variation rate in response to the timer indicating that the time-out has been detected.

21. The ignition system according to claim 16, wherein the control circuit includes:
a multiplier having an input and an output, the multiplier being configured to receive at the input a battery voltage for driving the ignition system and produce at the output the first threshold signal based a multiplication of the battery voltage and a proportionality constant.

22. The ignition system according to claim 16, further comprising:
a plurality of spark plugs configured to ignite a fuel of the internal combustion engine; and
a transformer having a primary coil coupled to an output of the switching device, a first secondary coil electrically coupled to a first one of the spark plugs, and a second secondary coil electrically coupled to a second one of the spark plugs.

23. A method, comprising:
controlling a switching device of an ignition system of an internal combustion engine, the controlling including:
comparing an output voltage of the switching device with a first threshold and providing a first threshold signal in response to detecting that the output voltage has reached the first threshold;
comparing the output voltage of the switching device with a second threshold and providing a second threshold signal in response to detecting that the output voltage has reached the second threshold;
controlling the switching device with a control signal that varies between a transfer value and an accumulation value;
causing the control signal to increase with a first variation rate during a first switching stage;
causing the control signal to increase with a second variation rate, lower than the first variation rate, during a second switching stage in response to the first threshold signal, and
causing the control signal to increase with a third variation rate, higher than the second variation rate, during a third switching stage in response to the second threshold signal.

24. The method according to claim 23, comprising:
detecting a time-out at which a duration of the second stage reaches a duration threshold; and
forcing the control signal to increase with the third variation rate in response to detecting the time-out.

25. The method according to claim 24, comprising increasing the second variation rate in response to detecting the time-out.

26. The method according to claim 23, comprising:
producing the first threshold signal based on a multiplication of a proportionality constant and a battery voltage for driving the ignition system.

* * * * *